United States Patent [19]

Horiguchi et al.

[11] Patent Number: 5,065,015
[45] Date of Patent: Nov. 12, 1991

[54] SOLAR RADIATION SENSOR FOR USE IN AN AUTOMATIC AIR CONDITIONER

[75] Inventors: Hyosei Horiguchi; Akira Tezuka, both of Katsuta; Tsuneo Kagohata; Toshikazu Ito, both of Ibaraki, all of Japan

[73] Assignee: Hitachi, Ltd., Tokyo, Japan

[21] Appl. No.: 310,647

[22] Filed: Feb. 15, 1989

[30] Foreign Application Priority Data

Feb. 26, 1988 [JP] Japan .................................. 63-45345

[51] Int. Cl.$^5$ ................................................. H01J 3/14
[52] U.S. Cl. .............................. 250/237 R; 250/203.4
[58] Field of Search ............... 250/211 R, 211 J, 551, 250/237 R, 203.4; 357/30, 47, 48; 356/225

[56] References Cited

U.S. PATENT DOCUMENTS

| 2,402,662 | 6/1946 | Ohl | 250/211 R |
| 3,539,883 | 11/1970 | Harrison | 250/211 J |
| 3,614,775 | 10/1971 | Brean | 250/211 J |
| 3,836,773 | 9/1974 | Burke et al. | 250/211 J |
| 4,358,186 | 11/1982 | Johnson et al. | 356/225 |
| 4,850,692 | 7/1989 | Hirao et al. | 250/237 R |

FOREIGN PATENT DOCUMENTS 61-210915 9/1986 Japan .

Primary Examiner—David C. Nelms
Assistant Examiner—S. Allen
Attorney, Agent, or Firm—Antonelli, Terry, Stout & Kraus

[57] ABSTRACT

Disclosed is a solar radiation sensor apparatus. A light-blocking plate is provided above the light-receiving surface of a photoelectric element, and has an area smaller than the area of the light-receiving surface. The incident angle sensitivity characteristic of the sensor apparatus can be improved without involving any increase in the external dimensions of the sensor apparatus.

14 Claims, 7 Drawing Sheets

RELATIVE SENSITIVITY Sr(%)

SOLAR RADIATION SENSOR FOR USE IN AN AUTOMATIC AIR CONDITIONER

BACKGROUND OF THE INVENTION

The present invention relates to a solar radiation sensor apparatus, and more specifically relates to improvements in the sensitivity characteristic with respect to the incident angle (hereafter referred to as "the incident angle sensitivity characteristic") of a solar radiation sensor apparatus in which a photoelectric element such as a photodiode is employed and which may be used in an automatic air conditioner of a vehicle.

A conventional solar radiation sensor apparatus in which a photoelectric element such as a photodiode is employed has an arrangement provided for the purpose of improving incident angle sensitivity characteristics. For instance, a plurality of photoelectric elements are used, as disclosed in Japanese Utility Model Unexamined Publication No. 58-36912, or a light attenuating filter provided for achieving a non-uniform distribution of the light transmittance is disposed above the light-receiving surface of the photoelectric element, as disclosed in Japanese Patent Unexamined Publication No. 61-210915.

According to the prior art disclosed in Japanese Utility Model Unexamined Publication No. 58-36912, however, since a plurality of photoelectric elements are used, the solar radiation sensor apparatus has increased external dimensions, while making production cost several times higher than before. According to the prior art disclosed in Japanese Patent Unexamined Publication No. 61-210915, since the light attentuating filter must have a diameter between 25 to 30 mm, the solar radiation sensor apparatus has increased external dimensions. In this way, either of the systems an and an increase in production cost.

SUMMARY OF THE PRESENT INVENTION

An object of the present invention is to provide a solar radiation sensor apparatus which is capable of providing an improved incident angle sensitivity characteristic without involving any increase in external dimensions, with only a small increase in production cost being incurred.

The above-stated object of the present invention is achieved by a solar radiation sensor apparatus comprising a light-blocking plate disposed above the light-receiving surface of a photoelectric element and having an area smaller than the area of the light-receiving surface.

DESCRIPTION OF THE PREFERRED EMBODIMENTS

The preferred embodiments of the present invention will be described hereunder with reference to FIGS. 1 through 17.

Figure 1:
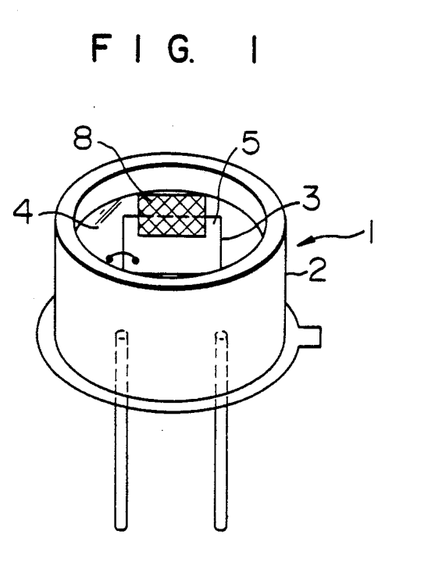
FIG. 1 is a perspective view of an example of a photodiode which may be used in a solar radiation sensor apparatus of the present invention.
Figure 2:
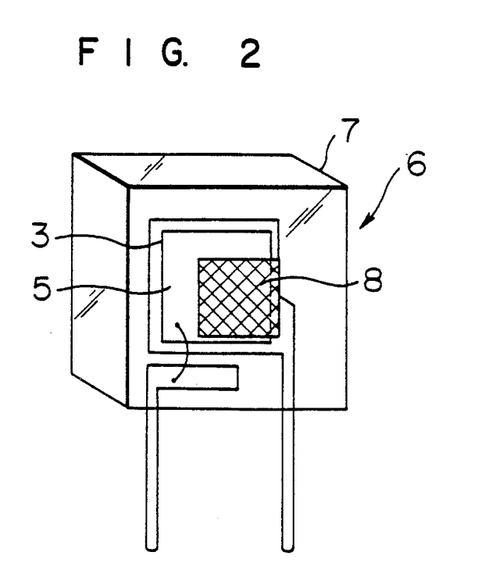
FIG. 2 is a perspective view of another example of a photodiode.

FIGS. 1 and 2 are perspective views of photodiodes of different types which may be used in the solar radiation sensor apparatus of the present invention. FIG. 1 shows a photodiode 1 of a metal-case type. In general, a photodiode of this type has an arrangement in which a square semiconductor chip 3 is disposed in a metal case 2 and is sealed by a piece of aperture glass 4, with the entire upper square surface of the semiconductor chip 3 serving as a light-receiving surface 5. Specific examples of products of this type include the silicon photodiode S2386-5K (produced by Hamamatsu Photonics K. K.). The light-receiving surface 5 has dimensions of 2.4 mm × 2.4 mm, and the distance between the light-receiving surface 5 and the outer surface of the aperture glass 4 is 1.4 mm.

FIG. 2 shows a photodiode 6 of a molded type. In general, a photodiode of this type has an arrangement in which a transparent molded resin 7 comprising an acrylic resin is mold-formed into a rectangular shape around a square semiconductor chip 3, with the entire upper square surface of the semiconductor chip 3 serving as a light-receiving surface 5. Specific examples of products of this type include the silicon photodiode S2506 (produced by Hamamatsu Photonics K. K.). The light-receiving surface 5 has dimensions of 3 mm × 3 mm.

In the case where the present invention is directly applied to a photodiode, such as a photodiode 1 or 6, per se, a piece of light-blocking tape 8, serving as a light-blocking plate, is attached to the outer surface of the aperture glass 4 or to a surface of the molded resin 7 as shown in FIGS. 1 or 2. The light-blocking tape 8 is formed of a material which is completely non-light-transmissive, and has a square shape with dimensions slightly smaller than those of the light-receiving surface 5. Instead of the light-blocking tape 8, printing may be effected to provide a non-light-transmissive portion.

Figure 3:
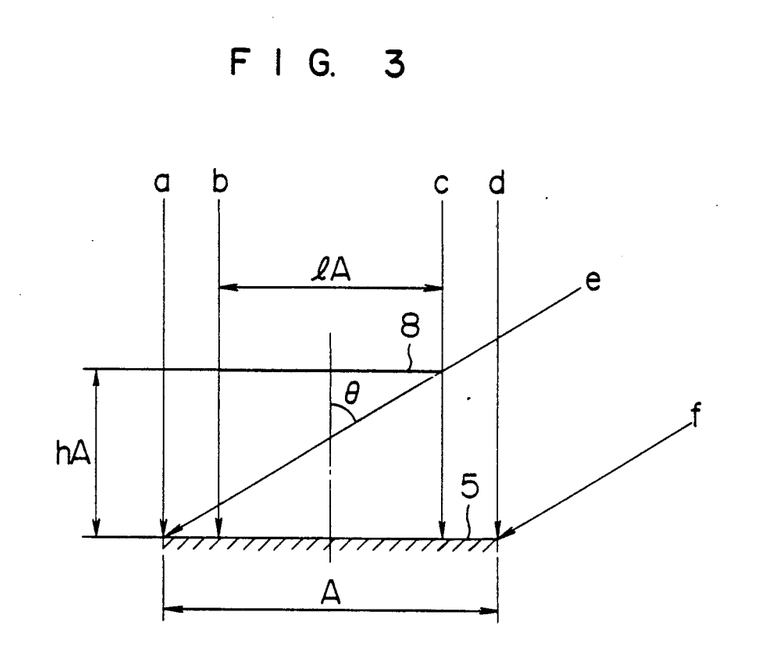
FIGS. 3 and 4 are views used to explain the principles of the operation of a light-blocking plate used in accordance with the present invention.
Figure 4:
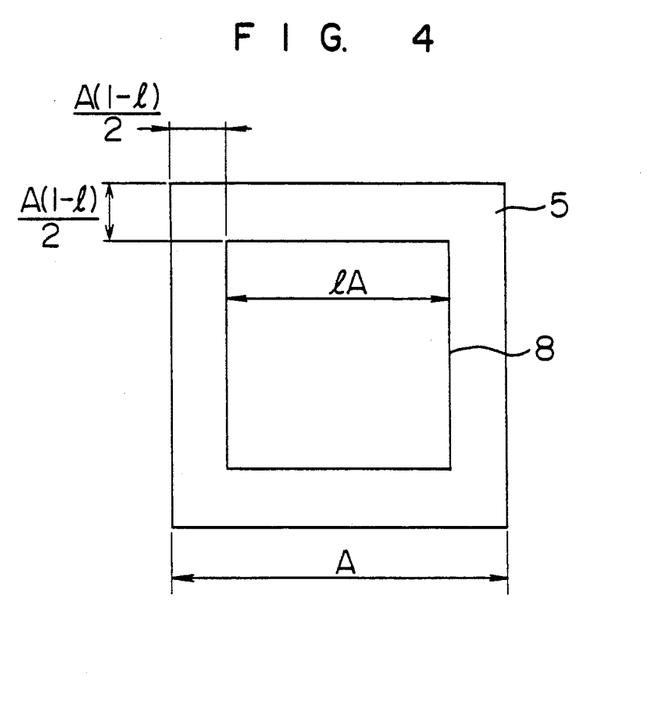

Referring to FIGS. 3–7, explanations will be given concerning the principles of improvement in the incident angle sensitivity characteristic which is achieved by adopting the above-described light-blocking structure. FIG. 3 is a view showing the positional relationship between the light-receiving surface 5 and the light-blocking tape, i.e. the light-blocking plate 8, which is taken in the horizontal direction. FIG. 4 is a view showing that relationship, which is taken from above. It is assumed that, when the central axes of the light-receiving surface 5 and the light-blocking plate 8 are aligned, if each side of the square light-receiving surface 5 has a length expressed as A, the length of each side of the square light-blocking plate 8 is expressed as lA, and the distance between the light-receiving surface 5 and the light-blocking plate 8 is expressed as hA. It is also assumed that a line normal to the light-receiving surface 5 and the incident rays form an incident angle $\theta$. On these assumptions, the sensitivity S of the photodiode is expressed by the following equation (1) in the case where no light-blocking plate 8 is used:

$$S = C \cdot A^2 \cos \theta$$

(C being the constant of proportion)  (1)

Figure 5:
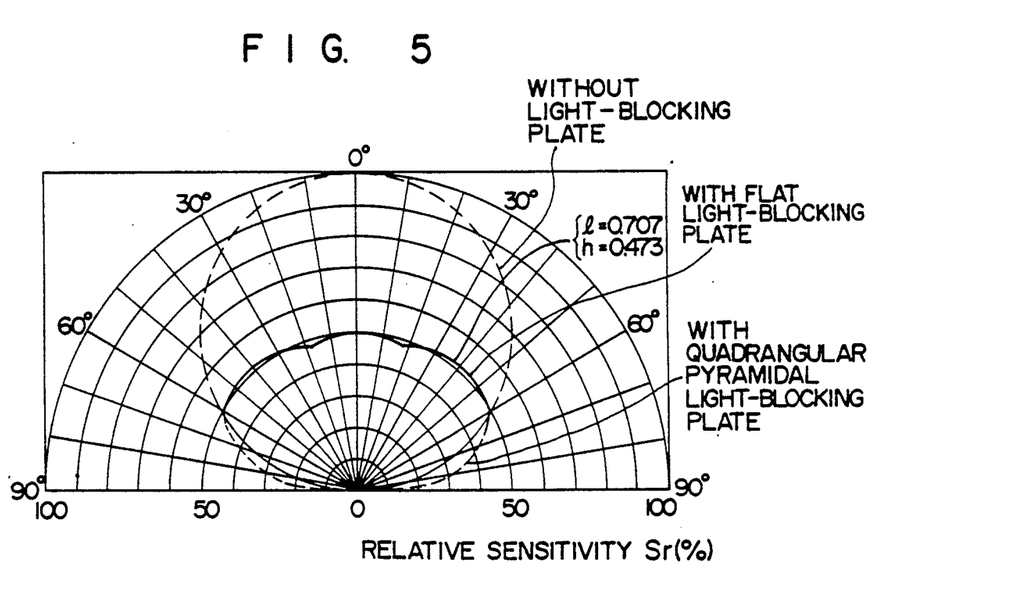
FIGS. 5, 6, and 7 are views showing various incident angle relative sensitivity characteristics, which also show the incident angle relative sensitivity of a solar radiation sensor apparatus to which the present invention is applied.

S expressed by the equation (1) assumes the maximum value when $\theta = 0°$. The relative sensitivity Sr (%), which is the sensitivity ratio relative to the 100% sensitivity determined by this maximum value of S, changes with changes in the incident angle $\theta$ along a characteristic curve indicated by the broken line in FIG. 5. Although shown in FIG. 5 are relative sensitivity characteristics with respect to the incident angle, these characteristics correspond to the incident angle sensitivity characteristics. The relative sensitivity Sr characteristic describes a circular curve, and, as will be understood from the figure, the sensitivity Sr is lower when $\theta > 30°$, i.e., when rays are incident from oblique directions than when $\theta = 0°$, i.e., when rays are incident from directly right above. On the other hand, if the solar radiation sensor is used in a vehicle, correction in accordance with the solar radiation is most necessary when the directions of incidence are oblique, i.e., when $\theta = 30°$ to 60°, because at this time, the occupants of the vehicle are most likely to be exposed to direct sunlight. For this reason, it is undesirable if the incident angle sensitivity characteristic describes a circular curve, and the characteristic should preferably describe a fan-shaped curve, exhibiting higher degrees of sensitivity when rays are obliquely incident.

Next, a case where a light-blocking plate 8 is provided in a manner such as that shown in FIGS. 3 and 4 will be described. When rays are vertically incident (i.e., when $\theta = 0°$), among the incident rays within a region a–d, the incident rays that are within a region b–c are blocked by the light-blocking plate 8, resulting in a large reduction in the sensitivity. However, when rays are obliquely incident (i.e., when $\theta$ is greater than a certain angle), the incident rays, e.g. incident rays within a region e–f, are completely kept from being blocked by the light-blocking plate 8, resulting in no reduction in sensitivity being caused by the light-blocking plate 8. Consequently, the sensitivity obtained when rays are obliquely incident increases relative to the sensitivity obtained when rays are vertically incident. Thus, the incident angle sensitivity characteristic is improved.

In the case being discussed where a light-blocking plate 8 is provided in a manner such as that shown in FIGS. 3 and 4, the relative sensitivity Sr (i.e., the sensitivity ratio relative to the 100% sensitivity determined by the maximum value obtained without using any light-blocking plate 8) changes with changes in the incident angle $\theta$ in the manner expressed by the following theoretical equations:

When $0 \leq \theta < \tan^{-1}\{(1 - l)/2h\}$,
$Sr = 100 \times (1 - l^2) \cos \theta$  (2)
When $\tan^{-1}\{(1 - l)/2h\} \leq \theta < \tan^{-1}\{(1 + l)/2h\}$,
$Sr = 100 \times [1 + l\{(1 - l)/2 + h \tan \theta - 1\}] \cos \theta$  (3)
When $\tan^{-1}\{(1 + l)/2h\} \leq \theta \leq 90°$,
$Sr = 100 \times \cos \theta$  (4)

Based on these theoretical equations, a certain combination of l and h which assures the minimum possible change in the relative sensitivity Sr within the range of $0° \leq \theta \leq 60°$ is calculated. As a result, $l = 0.707$ and $h = 0.473$ are obtained. The incident angle relative sensitivity Sr characteristic is calculated using the thus obtained combination. The result of this calculation is indicated by the solid line in FIG. 5. The resultant characteristic assures that Sr = 48% to 52% within the range of $0° \leq \theta \leq 60°$, thus proving to be flat and preferable.

Figure 6:
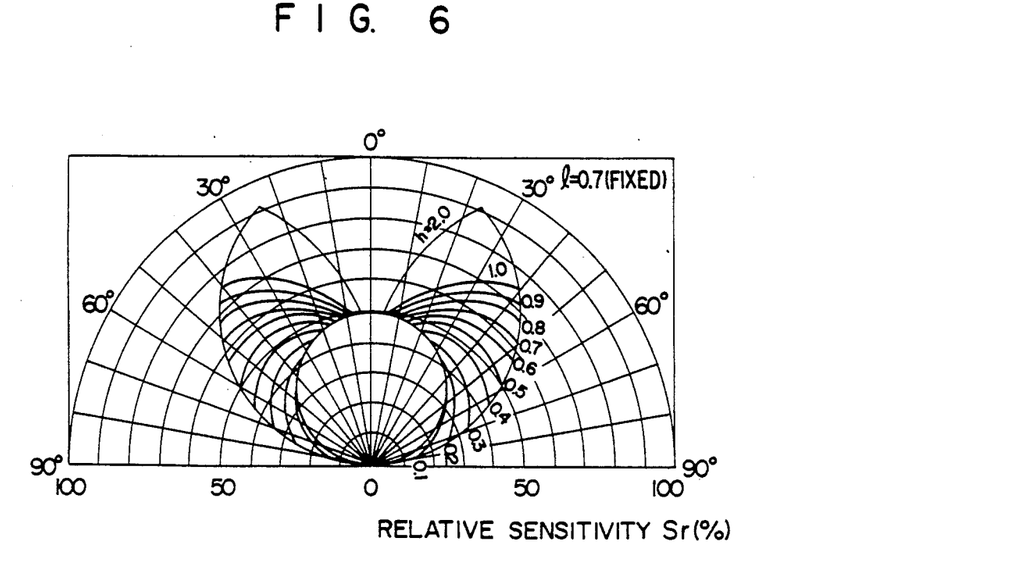
Figure 7:
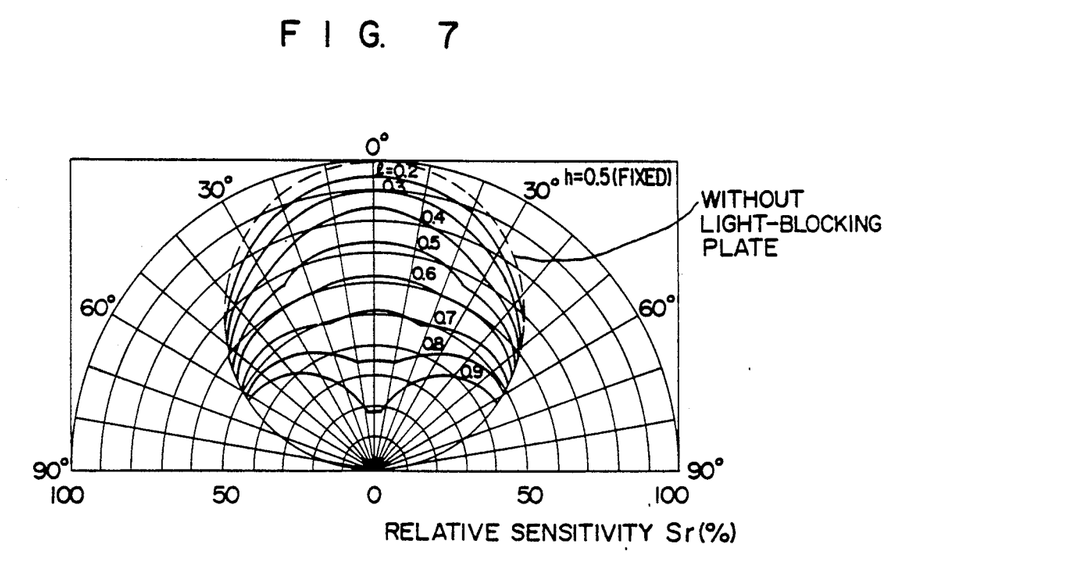

FIGS. 6 and 7 show the results of calculations concerning how the configuration described by the incident angle relative sensitivity characteristic changes when various values of l or h are used. FIG. 6 shows the manner in which the characteristic changes when h, the distance ratio, is varied from 0.1 to 2.0 while l, the width ratio, remains fixed at 0.7. The characteristic is flattest when h = 0.5. As h increases from this value, the sensitivity ratio Sr increases with respect to $\theta$ within the range between 30° and 50°. FIG. 7 shows the manner in which the characteristic changes when the width ratio l is varied from 0.2 to 0.9 while the distance ratio h remains fixed at 0.5. The characteristic is flattest when l = 0.7. As l increases from this value, the sensitivity ratio Sr increases with respect to $\theta = 0°$ whereas, as l decreases, the sensitivity ratio Sr lowers with respect to $\theta = 0°$.

It will be understood from the explanation given above that when various values of l and h are combined, it is possible to produce various characteristic curves of the incident angle sensitivity ratio Sr characteristic, and it is also possible to select the optimal characteristic in accordance with the vehicle in which the solar radiation sensor apparatus is to be installed. For instance, if a flat sensitivity characteristic with respect to the incident angle is desired, a sensor apparatus in which the distance ratio h is within the range between 0.4 and 1.0 and the width ratio l is within the range between 0.6 and 0.9 can be used and can provide advantageous effects. Incidentally, when the width ratio within the range between 0.6 to 0.9 is converted into the corresponding area ratio, the area ratio is approximately between 0.4 and 0.8.

Figure 8:
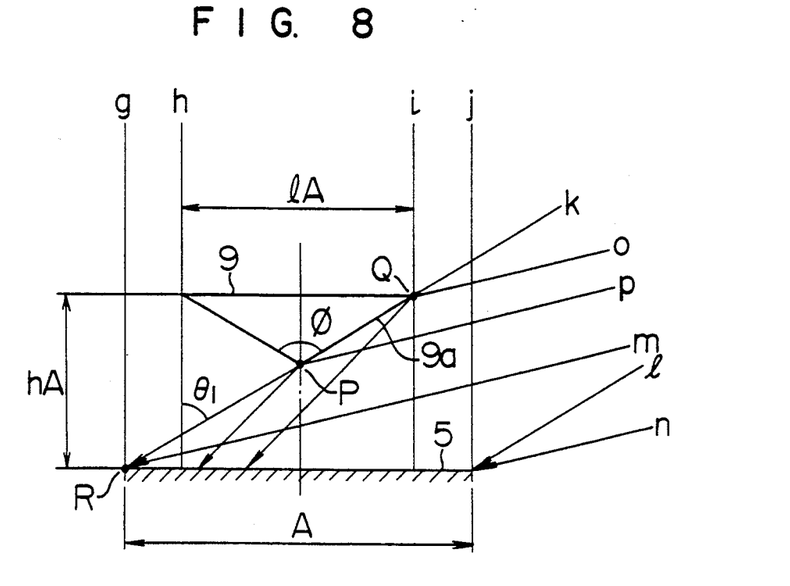
FIGS. 8 and 9 are views used to explain principles of operation in the case where a pyramid-shaped light-blocking plate is used.
Figure 9:
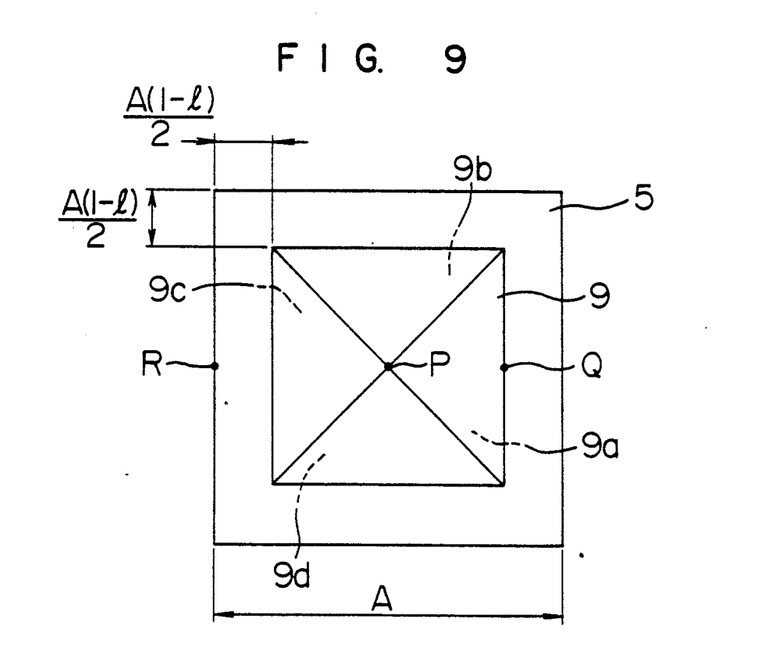

In the above-described case, the light-blocking plate is flat. However, in order to achieve a further increase in the sensitivity to obliquely incident rays, the light-blocking plate may alternatively be pyramid-shaped. FIGS. 8 and 9 concern another case in which a light-blocking plate 9 of the latter type is used. FIG. 8 is a view showing the positional relationship between the light-receiving surface 5 and the light-blocking plate 9, which is taken in the horizontal direction. FIG. 9 is a view showing that relationship, which is taken from above. The light-blocking plate 9 has the configuration of a regular quadrangular pyramid, and is disposed with the apex P of the pyramid being directed toward the light-receiving surface 5. The plate 9 has an arrangement in which the apex angle $\phi$ of the quadrangular pyramid is such that a straight line passes through the midpoint Q of a side of the base of the pyramid, the apex P, and the midpoint R of the opposing side of the light-receiving surface 5. The plate 9 also has an arrangement in which the four side faces 9a to 9d of the quadrangular pyramid which face the light-receiving surface 5 are formed as mirror surfaces. The apex angle $\phi$ can be expressed by the following equation:

$$\phi = 2 \tan^{-1}\{(l+I)/2H\} \qquad (5)$$

When rays are incident at an angle smaller than the incident angle $\theta 1$ shown in FIG. 8, because the rays are blocked by the base of the quadrangular pyramid alone, the incident angle sensitivity characteristic is not influenced by whether the four side faces 9a to 9d exist or not. At this time, therefore, the characteristic is the same as that obtained in the case explained with reference to FIGS. 3 and 4, where a flat shaped light-blocking plate 8 is used. However, when rays are incident at an angle above $\theta 1$, some of the rays which are within a region m-n, shown in FIG. 8, are directly incident on the light-receiving surface 5, and, in addition, other rays which are within a region o-p are incident on the light-receiving surface 5 after they have been reflected by the side face 9a of the quadrangular pyramid. As a result, the sensitivity ratio Sr increases when compared to that obtained by using the flat-light-blocking plate 8. In this way, it is possible to increase the sensitivity in the regions in which rays are obliquely incident and in which the relative sensitivity Sr might drop as sharply as indicated by the broken line in FIG. 5. Thus, the incident angle sensitivity characteristic can be further improved.

Figure 10:
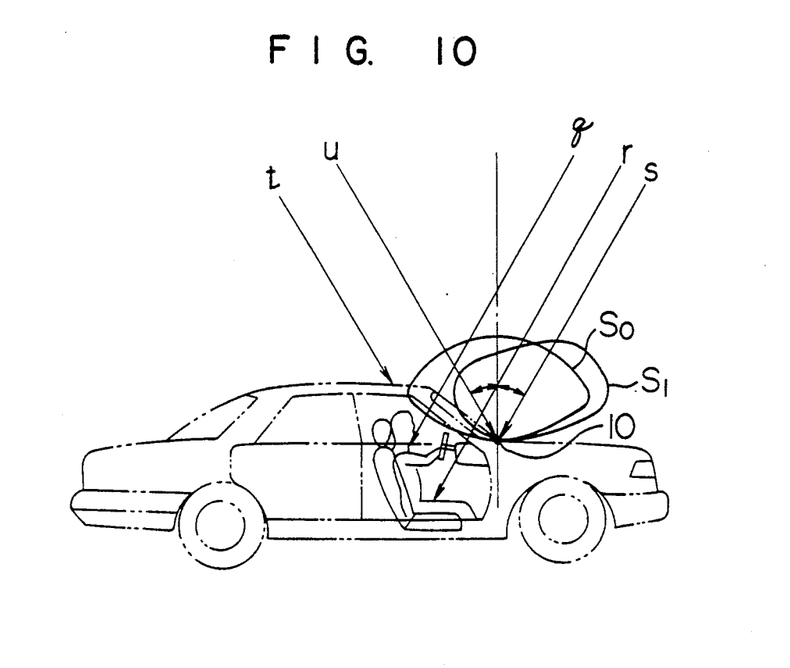
FIG. 10 is a view showing the relationship between a vehicle and the incident angle.
Figure 11:
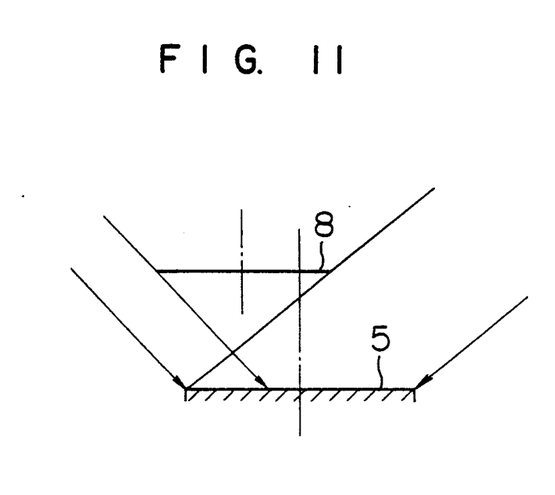
FIG. 11 and 12 are views used to explain the principles of operation in the case where a light-blocking plate is disposed in such a manner as to be deviated from the light-receiving surface.
Figure 12:
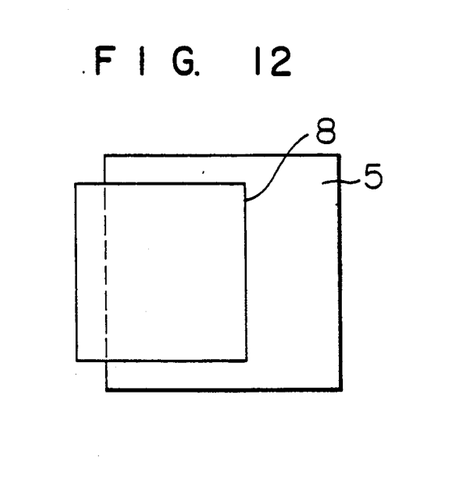

In the examples illustrated in the foregoing explanations, since the central axis of the light-receiving surface 5 and the central axis of the light-blocking plate 8 or 9 are aligned, the resultant characteristic curve of the incident angle sensitivity characteristic has a symmetric configuration with respect to the central axis of the light-receiving surface 5. However, with certain configurations of the relevant vehicle, it is desired that the characteristic curve be asymmetric with respect to the central axis. For instance, if a solar radiation sensor apparatus 10 is installed in a typical passenger car as shown in FIG. 10, the sensor apparatus 10 is usually disposed on the upper surface of the instrument panel and adapted to mainly detect solar radiation entering through the front windshield. On the other hand, the degree to which occupants of the vehicle are exposed to the solar radiation greatly varies depending on whether the rays of solar radiation are incident from the front side or the rear side of the vehicle. When the solar radiation rays are incident from the front side of the vehicle, occupants may be directly exposed to rays, as denoted at q-r, whereas when the solar radiation rays are incident from the rear side of the vehicle, the rays are blocked by the roof and are thus kept from being directly cast on the occupants, as denoted at t -u. However, rays are incident on the solar radiation sensor apparatus 10 from both the front side and the rear side, as denoted at s-u. If the incident angle sensitivity characteristic is a symmetrical characteristic SO, rays from the front side and rays from the rear side are detected as being at the same value. This is disadvantageous because correction in accordance with the solar radiation cannot be performed in compliance with the degree by which the temperature perceived by the occupants is raised on account of the solar radiation. In such cases, therefore, an asymmetrical characteristic S1 whereby rays from the front side are detected with a relatively higher sensitivity while a relativity the rays from the rear side are detected with a relatively lower sensitivity, is preferred to insert the symmetrical characteristic SO. In order to achieve such an asymmetrical characteristics S1, the central axis of the light-receiving surface 5 and that of the light-blocking plate 8 are shifted from each other, as shown in FIGS. 11 and 12. For instance, the light-blocking plate 8 is shifted toward the rear side of the vehicle.

Following the foregoing explanations concerning the principles, the specific structure of a solar radiation sensor apparatus to which the present invention is applied will now be described.

Figure 13:
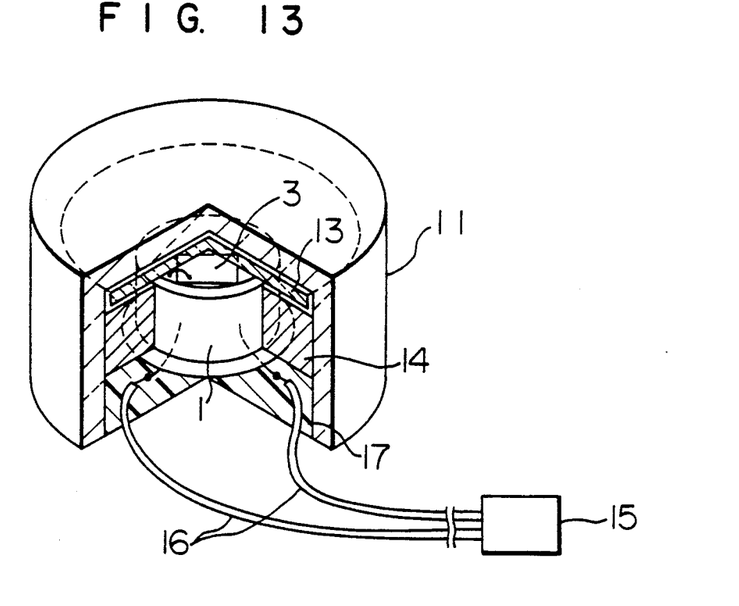
FIG. 13 is a partially cutaway perspective view of a solar radiation sensor apparatus in accordance with one embodiment of the present invention, which may be used in an automatic air conditioner of a vehicle.
Figure 14:
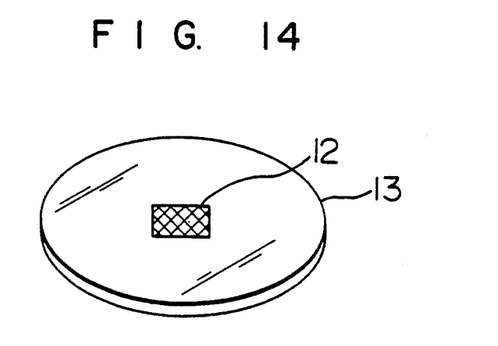
FIG. 14 is a perspective view of a substrate provided with a light-blocking plate.
Figure 15:
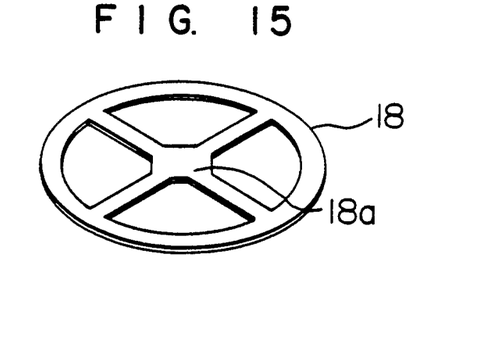
FIG. 15 is a perspective view of a different light-blocking plate.

FIG. 13 is a partially cutaway perspective view of a solar radiation sensor apparatus in which a photodiode 1 of a metal-case type is used. The sensor apparatus has an arrangement achieved in the following manner. First, a transparent substrate 13 (see FIG. 14) supporting a light-blocking plate 12 is disposed within an outer case 11 formed of a transparent resin material. The photodiode 1 and an inner case 14 holding the photodiode 1 therein are disposed in the case 11, and leads 16 connected to a connector 15 are soldered to lead bases leads of the photodiode 1. Finally, these members in the case 11 are sealed with a filler material 17 such as an epoxy resin. Thus, according to this embodiment, in contrast with the arrangement shown in FIG. 1 in which the light-blocking plate is provided on the aperture glass 4, the light-blocking plate 12 is provided on the transparent substrate 13 which is separate from the photodiode 1 as shown in FIG. 14. The transparent substrate 13 can be prepared by stamping a transparent sheet material to obtain a disc, and effecting printing on the center of the disc to provide a light-blocking printed portion. Instead of providing the light-blocking plate 12 on the transparent substrate 13, a different light-blocking plate 18 may be prepared by simply stamping an opaque sheet material or thin metal material, while providing a main light-blocking portion 18a in the center, as shown in FIG. 15.

Figure 16:
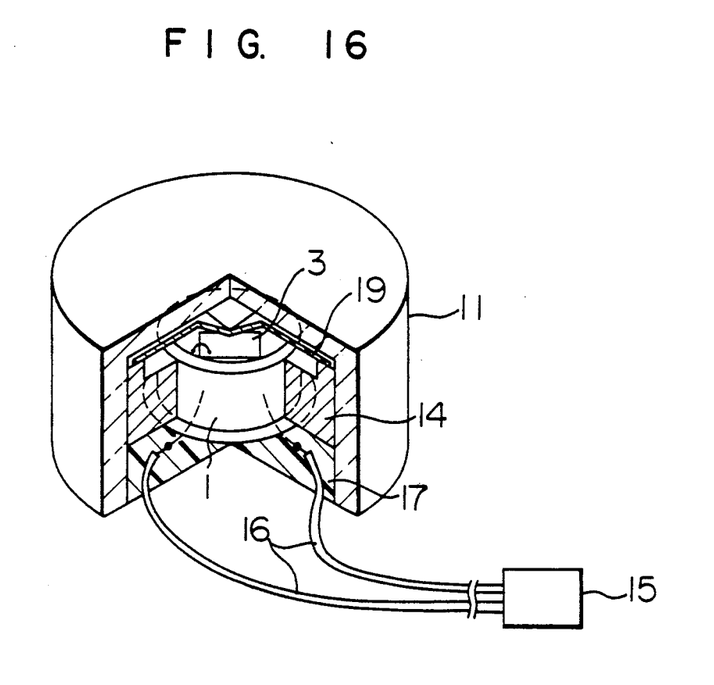
FIG. 16 is a partially cutaway perspective view of a solar radiation sensor apparatus in accordance with another embodiment of the present invention, which may be used in an automatic air conditioner of a vehicle.
Figure 17:
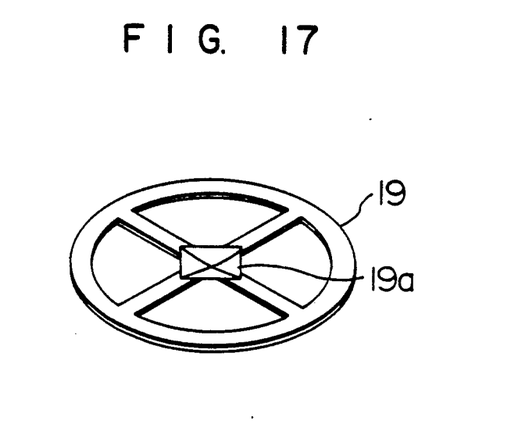
FIG. 17 is a perspective view of a light-blocking plate having a pyramid-shaped light-blocking portion.

FIG. 16 shows another solar radiation sensor apparatus. The structure of this sensor apparatus is substantially the same as that shown in FIG. 13, except that a light-blocking plate 19 has an arrangement in which the principles of the pyramid-shaped light-blocking plate 9 shown in FIGS. 8 and 9 are adopted. More specifically, as shown in FIG. 17, the light-blocking plate 19 is prepared by stamping a thin mirror-surfaced metal plate, and simultaneously stamping a quadrangular pyramid-shaped light-blocking portion 19a in the center. By virtue of this arrangement, the sensitivity to obliquely incident rays can be further improved, as described before regarding the light-blocking plate 9.

If the light-blocking plate is pyramid-shaped while the side faces of the pyramid are mirror-finished, this is advantageous for the following reason. When rays are obliquely incident at an angle greater than a certain incident angle, part of the rays are directly incident on the light-receiving surface and, in addition, another part of the rays are incident on that surface after having been reflected by a side face of the pyramid. In this way, the sensitivity to rays which are obliquely incident is increased, thereby allowing the incident angle sensitivity characteristic to possess a further improved characteristic curve.

If the light-receiving surface and the light-blocking plate are disposed with their centers being shifted from each other, the incident angle sensitivity characteristic becomes asymmetric in the direction in which the centers are relatively shifted. This arrangement may be advantageously adopted when it is desired that the incident angle sensitivity characteristic be asymmetric in the back-and-forth direction of the vehicle.

As has been described above, the ratio of the area of the light-blocking plate with respect to the area of the light-receiving surface may preferably be within the range between 0.4 and 0.8, and the ratio of the distance between the light-receiving surface and the light-blocking plate with respect to the width of the light-receiving surface may preferably be within the range between 0.4 to 1.0.

The light-blocking plate may be a coating or a flat-surfaced object such as a film. Also, the light-blocking plate may alternatively have a pyramid-shaped overall configuration disposed with the apex of the pyramid shape being directed to the light-receiving surface. In this case, the side faces of the pyramid shape may preferably be mirror-finished.

The center of the light-receiving surface and the center of the light-blocking plate may be aligned. However, in accordance with the condition of use, the center of the light-blocking plate may be shifted from the center of the light-receiving surface.

By virtue of the above-described arrangements of the present invention, the light-blocking plate which is smaller than the light-receiving surface blocks part of rays incident on the light-receiving surface, thereby lowering the level of the sensitivity of the photoelectric element. Because the level of sensitivity is lowered by a relatively smaller degree when rays are obliquely incident on the light-receiving surface than when rays are vertically incident on that surface, it is possible to improve the configuration of the characteristic curve of the incident angle sensitivity characteristic. The incorporation of the light-blocking plate causes substantially no increase in the external dimensions of the photoelectric element and, hence, causes no increase in the external dimensions of the solar radiation sensor apparatus. In addition, the incorporation of the light-blocking plate causes only a small increase in production cost.

In particular, it is possible to produce a flat characteristic curve of the incident angle sensitivity characteristic if the ratio of the area of the light-blocking plate with respect to the area of the light-receiving surface is between 0.4 and 0.8, and the ratio of the distance between the light-receiving surface and the light-blocking plate with respect to the width of the light-receiving surface is between 0.4 and 1.0.

Thus, according to the present invention, the incident angle sensitivity characteristic can be improved without involving any increase in the external dimensions of the solar radiation sensor apparatus, and with substantially no increase in production cost being incurred.

We claim:
1. A solar radiation sensor apparatus comprising:
   a photoelectric element having a light-receiving surface; and
   a light-blocking plate disposed a predetermined distance above said light-receiving surface and having an area smaller than the area of said light-receiving surface;
   wherein the predetermined distance and the area of the light-blocking plate are selected such that the light-blocking plate blocks solar radiation from illuminating a portion of the light-receiving surface when an incident angle of the solar radiation is less than a predetermined incident angle and permits the solar radiation to illuminate the entire light-receiving surface when the incident angle of the solar radiation is at least equal to the predetermined incident angle.

2. A solar radiation sensor apparatus according to claim 1, wherein the center of said light-receiving surface and the center of said light-blocking plate are shifted from each other.

3. A solar radiation sensor apparatus comprising:
   a photoelectric element having alight-receiving surface; and
   a light-blocking plate disposed a predetermined distance above said light-receiving surface and having an area smaller than the area of said light-receiving surface;
   wherein the ratio of the area of said light-blocking plate with respect to the area of said light-receiving surface is between 0.4 to 0.8, and the ratio of the distance between said light-receiving surface and said light-blocking plate with respect to the width of said light-receiving surface is between 0.4 to 1.0.

4. A solar radiation sensor apparatus according to claim 3, wherein the center of said light-receiving surface and the center of said light-blocking plate are shifted from each other.

5. A solar radiation sensor apparatus according to claim 3, wherein said light-blocking plate is pyramid-shaped, and is disposed with the apex of the pyramid shape being directed to said light-receiving surface, side faces of the pyramid shape being mirror-finished.

6. A solar radiation sensor apparatus according to claim 5, wherein the center of light-receiving surface and the center of said light-blocking plate are shifted from each other.

7. A solar radiation sensor apparatus comprising:
   a photoelectric element having a light-receiving surface; and
   a light-blocking plate disposed a predetermined distance above said light-receiving surface and having an area smaller than the area of said light-receiving surface;
   wherein said light-blocking plate is pyramid-shaped, and is disposed with the apex of the pyramid shape being directed to said light-receiving surface, side faces of the pyramid shape being mirror-finished.

8. A solar radiation sensor apparatus according to claim 7, wherein the center of said light-receiving surface and the center of said light-blocking plate are shifted from each other.

9. A solar radiation sensor apparatus comprising: a photoelectric element having alight-receiving surface; and a light-blocking plate disposed above said light-receiving surface and having an area smaller than the area of said light-receiving surface, said light-blocking plate being disposed in such a manner that, when the incident angle $\theta$ of solar radiation is between 30° and 60°, the entire light-receiving surface is irradiated by the incident rays.

10. A solar radiation sensor apparatus comprising:
a photoelectric-element semiconductor chip having a light-receiving surface;
a transparent body which is mold-formed around the entire periphery of said semiconductor chip except said light-receiving surface;
a piece of light-blocking tape having an area smaller than the area of said light-receiving surface and serving as a light-blocking plate, said piece of light-blocking tape being adhered to a surface comprising at least one of glass and mold-formed resin, said surface being disposed at a predetermined distance from said light-receiving surface of said semiconductor chip; and
leads for supplying electric power.

11. A solar radiation sensor apparatus according to claim 10, wherein the ratio of the area of said light-blocking plate with respect to the area of said light-receiving surface is between 0.4 and 0.8, and the ratio of the distance between said light-receiving surface and said light-blocking plate with respect tot he width of said light-receiving surface is between 0.4 and 1.0.

12. A solar radiation sensor apparatus according to claim 10, wherein said light-blocking plate is pyramid-shaped, and is disposed with the apex of the pyramid shape being directed to said light-receiving surface, side faces of the pyramid shape being mirror-finished.

13. A solar radiation sensor apparatus according to claim 10, wherein the center of said light-receiving surface and the center of said light-blocking plate are shifted from each other.

14. A solar radiation sensor apparatus comprising:
a photodiode on an upper surface of which a photoelectric-element semiconductor chip having a light-receiving surface is disposed;
a transparent substrate which covers an upper surface of said semiconductor chip and on which a light-blocking portion having an area smaller than the area of the light-receiving surface is printed, said light-blocking portion being printed on said transparent substrate at a predetermine distance from said upper surface of said semiconductor chip;
an inner case surrounding the periphery of said photodiode;
an outer case surrounding the peripheries of said transparent substrate and said inner case; and
a filler material which fills an opening of said outer case and in which leads are partially impregnated.

* * * * *